United States Patent
Gao

(10) Patent No.: US 8,677,302 B2
(45) Date of Patent: Mar. 18, 2014

(54) MULTI-THREADED DETAILED ROUTING

(75) Inventor: Tong Gao, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 186 days.

(21) Appl. No.: 12/695,452

(22) Filed: Jan. 28, 2010

(65) Prior Publication Data

US 2011/0055790 A1 Mar. 3, 2011

Related U.S. Application Data

(60) Provisional application No. 61/239,392, filed on Sep. 2, 2009.

(51) Int. Cl.
*G06F 17/50* (2006.01)

(52) U.S. Cl.
USPC .......................................... 716/130

(58) Field of Classification Search
USPC .................................. 716/100, 130
See application file for complete search history.

(56) References Cited

U.S. PATENT DOCUMENTS

| | | | | |
|---|---|---|---|---|
| 2003/0101428 A1* | 5/2003 | Teig et al. | | 716/14 |
| 2003/0115566 A1* | 6/2003 | Teig | | 716/14 |
| 2004/0044979 A1* | 3/2004 | Aji et al. | | 716/13 |
| 2007/0028201 A1* | 2/2007 | Mehrotra et al. | | 716/12 |
| 2009/0031269 A1* | 1/2009 | Chen et al. | | 716/9 |
| 2010/0169858 A1* | 7/2010 | Betz et al. | | 716/12 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Some embodiments provide techniques and systems for routing nets in a circuit design in parallel. During operation, the system can receive a set of partitions for a circuit design, wherein each partition has zero or more overlapping partitions along four directions, e.g., up, down, left, and right. Next, the system can perform, in parallel, detailed routing on non-overlapping partitions in the set of partitions, wherein detailed routing is performed on a partition after detailed routing is completed on adjacent or overlapping partitions that located along two perpendicular directions. In some embodiments, each detailed routing thread that is executing in parallel performs detailed routing on a different net.

21 Claims, 9 Drawing Sheets

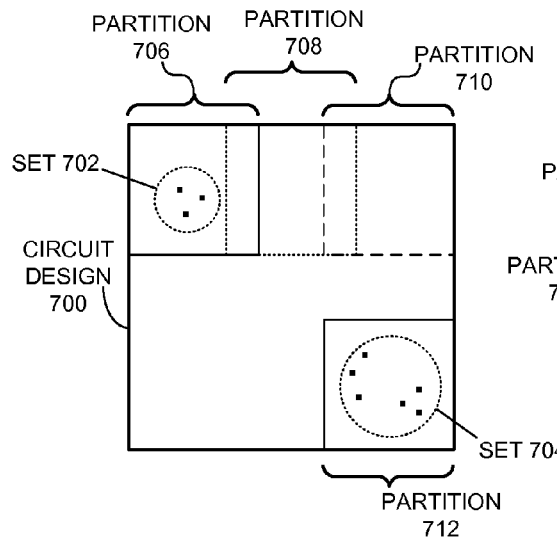
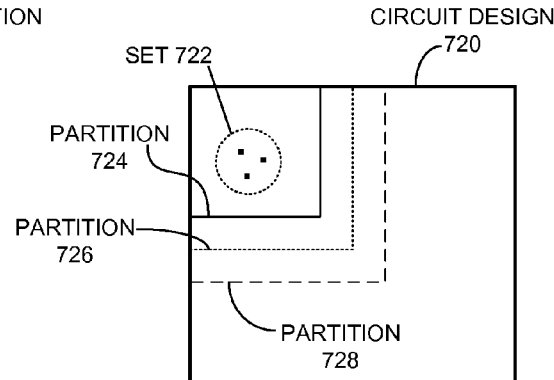
FIG. 7A  FIG. 7B
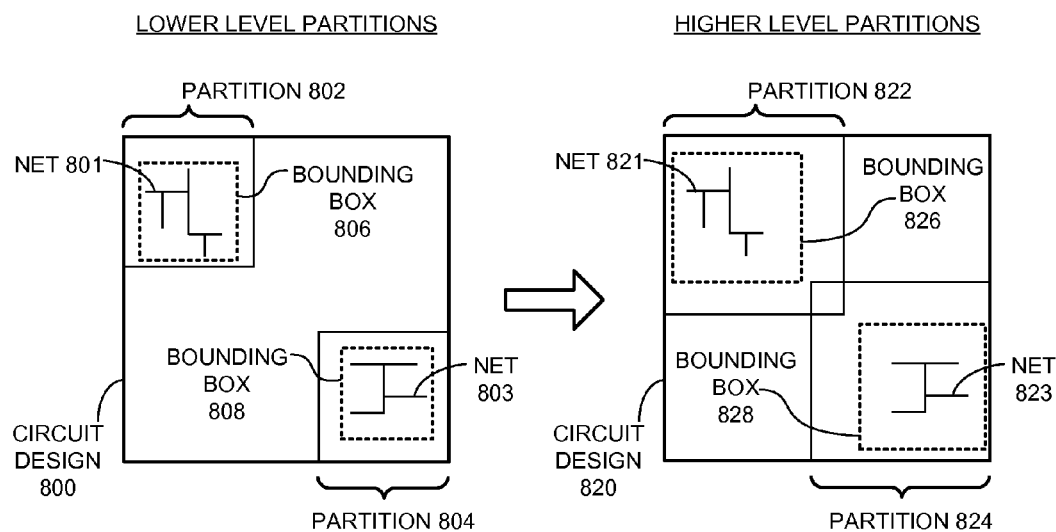
FIG. 8

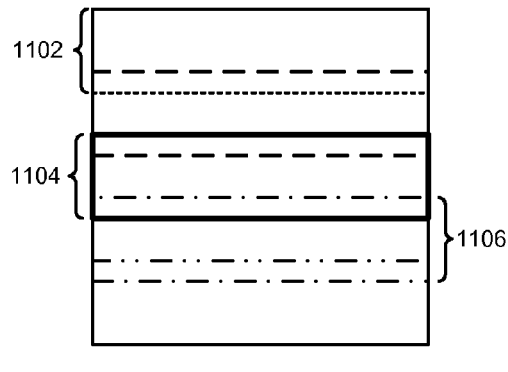
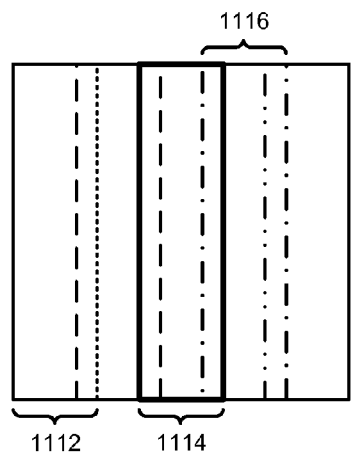
FIG. 11A FIG. 11B
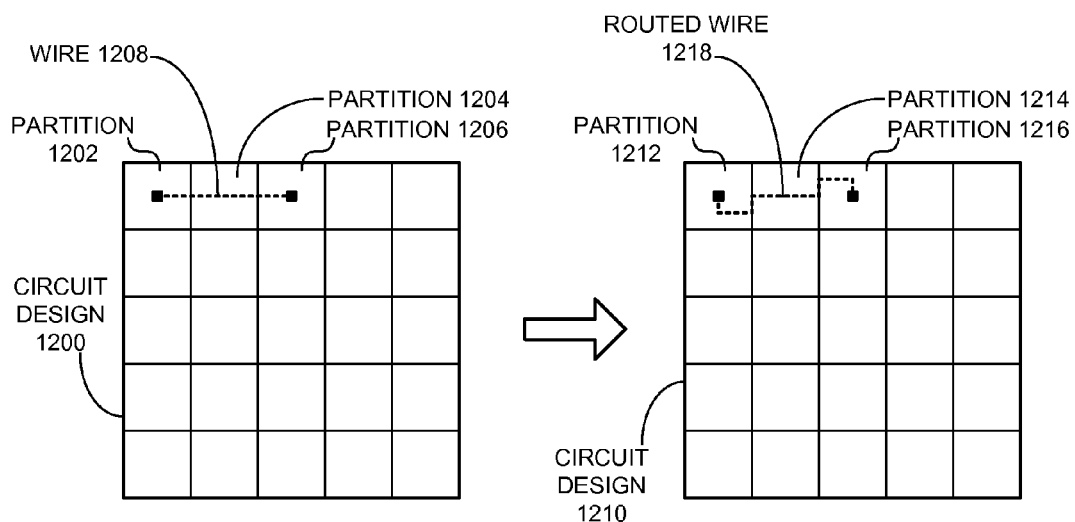
FIG. 12

MULTI-THREADED DETAILED ROUTING

RELATED APPLICATION

This application claims the benefit of U.S. Provisional Application No. 61/239,392, entitled "Multi-Threaded Global Routing, Track Assignment, and Detailed Routing," by inventors Heng-Yi Chao, Abhijit Chakanakar, Jayanth Majhi, and Tong Gao, filed 2 Sep. 2009.

BACKGROUND

1. Technical Field

This disclosure generally relates to electronic design automation. More specifically, this disclosure relates to a method and a system for routing nets of an integrated circuit chip design.

2. Related Art

Advances in semiconductor technology presently make it possible to integrate hundreds of millions of transistors onto a single semiconductor chip. This dramatic increase in semiconductor integration densities has made it considerably more challenging to efficiently design circuits.

Specifically, routing a circuit design involves determining routes for metal wires which electrically connect circuit elements to produce routed circuits that perform desired functions. Unfortunately, routing wires of a large circuit design can take several days using conventional routing techniques. Hence, it is desirable to improve routing performance, especially for large circuit designs.

SUMMARY

Some embodiments provide techniques and systems for routing nets in a circuit design in parallel. The design area can be partitioned into a set of partitions which can be overlapping or non-overlapping. During operation, the system can receive a set of partitions for a circuit design, wherein each partition can have overlapping or non-overlapping partitions along four directions, e.g., up, down, left, and right. Next, the system can perform, in parallel, detailed routing on non-overlapping partitions in the set of partitions, wherein detailed routing is performed on a partition after detailed routing is completed on adjacent or overlapping partitions which are located along two perpendicular directions.

The sequence in which detailed routing is performed on the set of partitions depends on which two perpendicular directions are used. Specifically, if the two perpendicular directions are up and left, the detailed routing process can begin at the top left partition and progress towards the bottom right partition. If the two perpendicular directions are up and right, the detailed routing process can begin at the top right partition and progress towards the bottom left partition. If the two perpendicular directions are down and left, the detailed routing process can begin at the bottom left partition and progress towards the top right partition. Finally, if the two perpendicular directions are down and right, the detailed routing process can begin at the bottom right partition and progress towards the top left partition.

In some embodiments, each detailed routing thread that is executing in parallel performs detailed routing on a different net. Specifically, a thread can try to obtain a lock for a net before performing detailed routing on the net. If the thread is unable to obtain a lock, the thread can queue the detailed routing task for the net in a task queue, and try to perform detail routing on another net.

BRIEF DESCRIPTION OF THE FIGURES

FIG. 7A illustrates nets that are routed in parallel for non-overlapping partitions in accordance with an embodiment of the present invention.

FIG. 7B illustrates a hierarchy of partitions for a circuit design in accordance with an embodiment of the present invention.

FIG. 8 illustrates a net assigned to a partition of a circuit design based in part on a bounding box for the net in accordance with an embodiment of the present invention.

FIG. 11A illustrates a circuit design divided into a set of horizontal partitions in accordance with an embodiment of the present invention.

FIG. 11B illustrates a circuit design divided into a set of vertical partitions in accordance with an embodiment of the present invention.

FIG. 12 illustrates a suboptimal routing solution for a wire of a circuit design in accordance with an embodiment of the present invention.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit (IC) Design Flow

Figure 1:
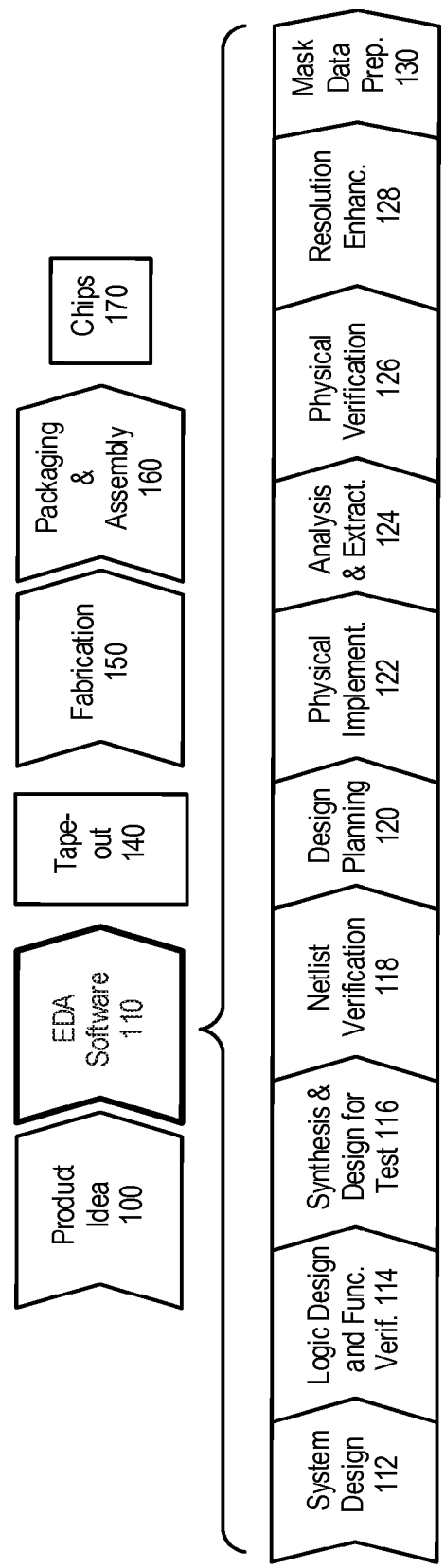
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

The Routine Problem

Figure 2:
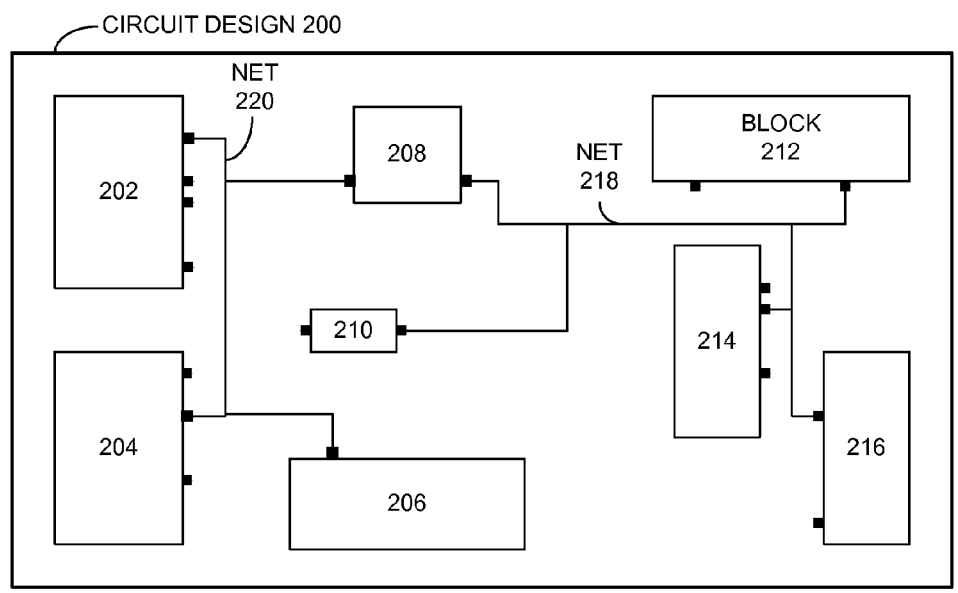
FIG. 2 illustrates an exemplary circuit design that presents a typical routing problem in accordance with an embodiment of the present invention.

FIG. 2 illustrates an exemplary circuit design that presents a typical routing problem in accordance with an embodiment of the present invention.

Circuit design 200 includes a set of blocks (e.g., blocks 202-216) that may represent circuit objects at any level in the design hierarchy. For example, the blocks can be cells, macros, or any other circuit object at any level of hierarchy. The routing process can be performed at different levels in the design hierarchy. However, the routing process typically operates at only one level at any given time.

The routing process or system can take multiple inputs, which include, but are not limited to: (a) a placed netlist which provides placement information for a set of cells, (b) a description of the technology (i.e., the number of metal layers, and the characteristics of the layers), (c) an assignment of pins/terminals to nets, (d) a set of design rules that must be satisfied by the routing solution, and (e) timing information, e.g., timing criticality.

The output of the routing system includes, but is not limited to, a netlist which electrically connects all pins/terminals that belong to each net, and a routing summary which can include wire length, via count, and unresolved DRCs.

A block of the circuit design can have one or more pins or terminals that are assigned to nets. The task for the routing system is to route wires in the circuit design so that the pins or terminals that belong to the same net are electrically connected together. For example, net 220 electrically connects pins in blocks 202-208, and net 218 electrically connects pins in blocks 208-216.

Note that a routing system should not generate a routing solution that electrically connects pins or terminals that belong to different nets. Further, the routing system should generate a routing solution that routes the wires using only the available routing resources, and the routed solution must not violate design rules (note that the design rules are usually provided as an input to the routing problem). For example, the design rules may specify that the distance between two adjacent wires should be greater than a minimum distance, and that certain types of routing shapes are not allowed.

The design rules that need to be satisfied during routing may be different from the design rules that need to be satisfied in a different stage in the electronic design automation (EDA) flow. Specifically, the design rules that are used during design signoff may be more precise and complicated than the design rules that are used during the routing stage.

During the placement stage, some techniques may perform a trial routing to guide the placement. For example, the placement technique may perform a quick and approximate routing to determine whether a particular placement of cells is expected to cause routing congestion. A trial routing may also be performed to determine a timing estimate, and may be performed during a routing optimization process.

A routing process typically has three stages: global routing, track assignment, and detailed routing. However, the number of stages in the process can be more or fewer than three. For example, some techniques collapse the last two stages so that they only have two stages: global routing and detailed routing. In another example, the routing process might include a fourth stage which places redundant vias.

In the global routing stage, the system does not create detailed routing shapes for the wires. Instead, the system determines the topologies of multi-pin nets and areas that the nets should go through to minimize routing congestion and minimize the overall wire length.

In the track assignment stage, the system refines the global routing plan by assigning wires to tracks. Note that, although the track assignment may generate detailed routes for the wires, the routing solution at this stage may not satisfy all of the design rules because this stage typically uses a simpler routing model than the next stage, namely, detailed routing.

Finally, in the detailed routing stage, the system creates the exact path and the specific shapes for each wire. This stage is typically the most time-consuming and computationally intensive stage of the three stages. Note that all of the design rules are typically used in this stage to ensure that the routed wires do not violate any of the design rules.

Routing techniques typically operate at one physical hierarchy at a time. For example, during block level routing, the system does not work on the physical details inside cells or the macros. The system typically abstracts the cells and the macros to hide unnecessary details, thereby speeding up the routing process. At the top level, the system typically represents macros and standard cells as blocks. Each macro and standard cell typically has multiple pins which need to be electrically connected based on their net assignments.

Note that routing can be performed using different approaches. For example, routing can be performed using a top-down approach or a bottom-up approach. In the top-down approach, the top-level routing is performed before bottom-level routing. In this approach, the system may create soft-macros which reserve space for routing the lower hierarchies.

In contrast, in the bottom-up approach, the bottom-level routing is performed before the top-level routing. Since the lower-level routing is performed before higher-level routing, soft-macros are usually not required in this approach.

There are a number of optimization criteria that need to be considered during routing. Specifically, the optimization criteria include, but are not limited to: (a) minimizing design rule violations, (b) minimizing via count, (c) minimizing total wire length, (d) minimizing the likelihood of timing violations, and (e) criteria related to design for manufacturing (DFM), e.g., placing redundant vias, trying to minimize critical area to reduce the probability that contamination particles will cause shorts and opens during manufacturing, and trying to maximize straight wire segments to decrease layout complexity and increase manufacturability.

Note that it may not be possible to "optimize" (e.g., "minimize") all of the criteria at the same time. In fact, it may not be possible to determine a global optimum for even a single criterion. Hence, the terms "optimizing," "minimizing," etc. are used in this disclosure to indicate that the routing process tries to optimize one or more criteria (e.g., tries to minimize the total wire length), but the routing process may terminate before a global optimum is determined for one or more criteria.

Global Routing

The global routing process is typically used many times during the IC design flow. In the global routing stage, the system needs to route millions of nets to avoid congestion and ensure that the eventual routes will be close to the optimal routes. The reason it is difficult is because the global routing process tries to globally balance the congestion.

The input to the global routing problem is the same as the routing problem: a set of placed cells which have pins which are assigned to nets. In global routing, the chip is divided into a coarse grid, where each cell in the grid is called a g-cell. For example, a chip may be divided into a 10×10 array of g-cells. Next, the process determines the number of wires that need to be routed from one g-cell to another. The process then determines routes for these wires that pass through intermediate g-cells, and keeps track of the number of wires that are passing through each g-cell. In this manner, the system can estimate the congestion of each g-cell. During a global routing process, the system keeps track of two metrics for each g-cell: the capacity of each g-cell and the density of wires in each g-cell. Specifically, if the wire density exceeds the g-cell's capacity, the system determines the g-cell to be congested.

Figure 3:
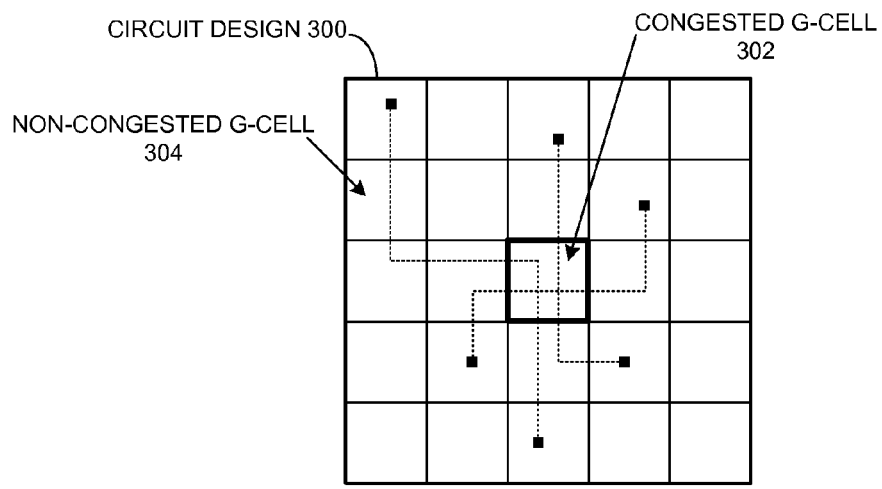
FIG. 3 illustrates a congested g-cell in a circuit design in accordance with an embodiment of the present invention.

FIG. 3 illustrates a congested g-cell in a circuit design in accordance with an embodiment of the present invention.

Circuit design 300 is divided into g-cells, and wires are routed through the g-cells. Let us assume that each g-cell has a capacity of two. Note that g-cell 304 does not exceed its capacity because only one wire passes through g-cell 304. Thus g-cell 304 is not congested. G-cell 302, on the other hand, is congested because three wires pass through g-cell 302, which exceeds the g-cell's capacity.

The global routing process routes the wires to minimize wire length, via count, and optimize congestion. Specifically, the system may try to minimize the peak congestion across all g-cells. Note that the order in which the wires are routed affects the final solution. For example, if a wire is routed through a particular g-cell and exhausts the g-cell's capacity, subsequent wires may not be routed through this g-cell.

Multi-Threaded Global Routing

Multi-threading the global routing problem is very challenging. Specifically, two different processing threads create routing congestion when they route two wires simultaneously through the same area, which results in a suboptimal solution.

Moreover, multi-threaded routing techniques are often non-deterministic because it is difficult to predict the order in which the wires will be routed.

Predictability is an important consideration for users. The multi-threaded approach should result in the same routing solution as the single-threaded approach. For example, a multi-threaded routing technique that is designed to maximize threadability may generate different results from a single-threaded routing technique that is designed to generate a good routing solution, which is undesirable.

During a multi-threaded routing process, a circuit design can be divided into multiple partitions, and routing can be performed on multiple partitions in parallel. Note that a partition can be significantly larger than a g-cell, and that it is difficult to use a multi-threaded routing technique to route nets that span multiple partitions. However, if a net is enclosed completely within a partition, it becomes very unlikely that performing a routing operation on this net will impact routing operations performed in parallel on other nets that are completely within other non-overlapping partitions.

Some embodiments of the present invention use hierarchical partitions. At the lowest level in the partition hierarchy, the partitions are small, and they become bigger in area at higher levels of the partition hierarchy. Moreover, multiple partitions of the circuit design can overlap.

To ensure that a net is assigned to a partition that encloses the net completely, the system constructs a bounding box around each net, and uses the bounding box to determine whether the net is completely within a partition or not. For example, the system may construct a tight bounding box for a net that is based in part on the pins of the net. However, note that such a tight bounding box may constrain a routing operation on the net. Hence, the system may expand the size of the net's bounding box to provide more room for routing the net.

Note that routing a set of nets for a circuit design can require a sequence of routing iterations. If a net is routed through a congested g-cell in one iteration, the system may tweak the overflow cost and/or adjust the bounding boxes for the nets before performing another routing iteration. Also, note that two nets that are completely within two different non-overlapping partitions can be routed in parallel because they do not impact each other's routing.

Figure 4:
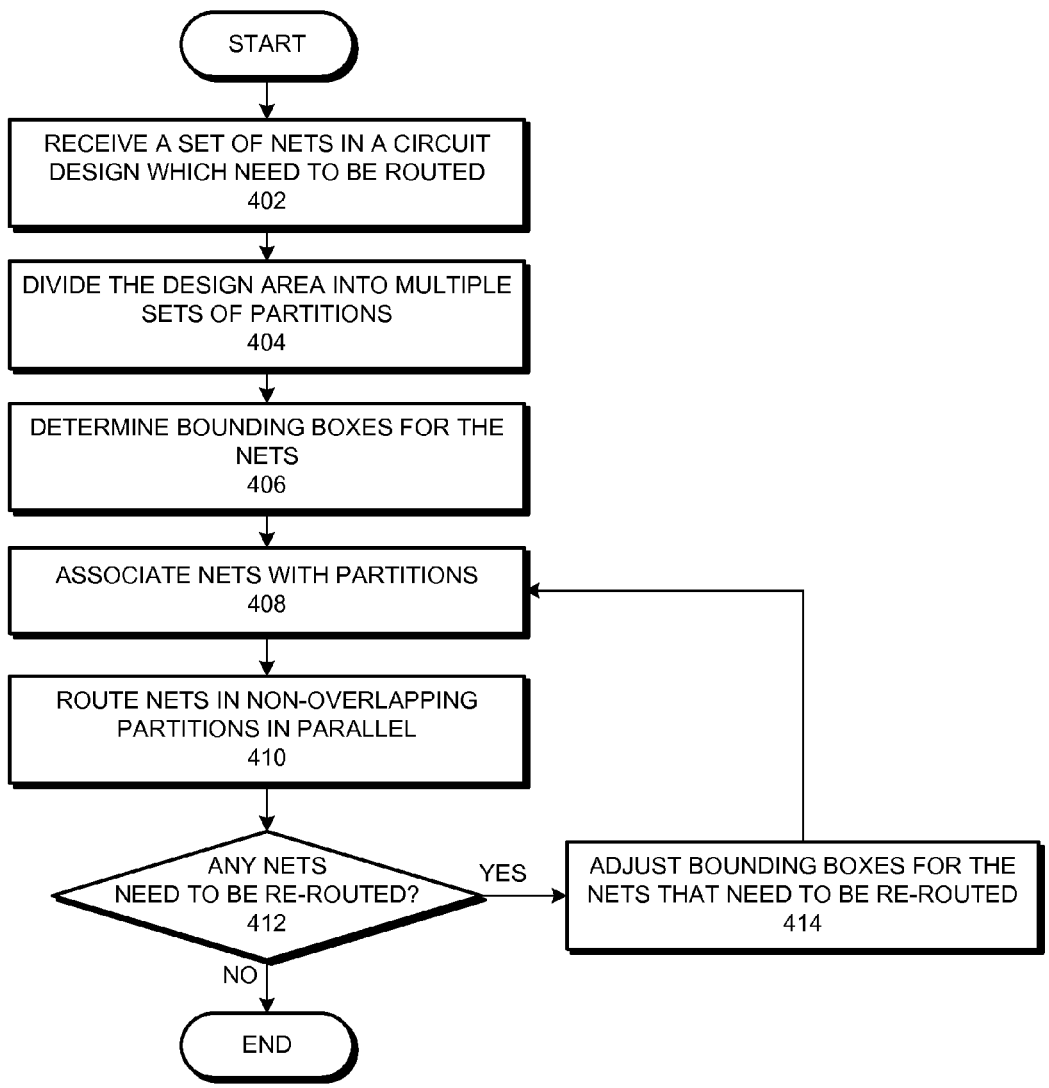
FIG. 4 presents a flow chart illustrating a process for routing multiple nets in parallel in accordance with an embodiment of the present invention.

FIG. 4 presents a flow chart illustrating a process for routing multiple nets in parallel in accordance with an embodiment of the present invention.

The process can be performed by a computer system which stores instructions and executes these instructions using a processor. The system can receive a set of nets in a circuit design which need to be routed (operation 402). Next, the system can divide the design area into multiple sets of partitions (operation 404). Note that each set of partitions can cover the whole design area. Note that partitions in different sets of partitions can have different sizes. Further, the multiple sets of partitions can be organized in a partition hierarchy. Specifically, the partition sizes can be small at lower levels of the partition hierarchy, and can progressively become larger at higher levels of the partition hierarchy.

The system can then determine bounding boxes for the nets (operation 406). Next, the system can associate the nets with partitions (operation 408), and route nets in non-overlapping partitions in parallel (operation 410). During operation 408, the system can associate nets with partitions by first determining, for each net, the smallest partition which encloses the net, and then associating the net to this partition. Note that, in the first iteration, all open nets can be identified and routed (the bounding box for each net can be calculated as a bloated bounding box that includes the pins that need to be connected).

Next, the system can determine whether any nets need to be re-routed (operation 412). If congestion does not occur in any g-cell of the circuit design, then no nets need to be re-routed, and the system completes the process. Otherwise, if one or more nets need to be re-routed, the system adjusts bounding boxes for the nets that need to be re-routed (operation 414), and returns to operation 408 to associate nets that need to be re-routed with partitions based on the new bounding boxes.

During operation 414, the system can expand the size of a bounding box for a net, or can adjust the dimensions of a bounding box with or without increasing the total area of the bounding box. In any case, when the size and/or shape of a bounding box is adjusted, the system may need to re-assign the corresponding net to a new partition when it returns to operation 408 because the new bounding box may not be completely within the previously assigned partition. The system can repeat this process until all nets have been routed successfully without congestion.

In some embodiments, the system can begin by routing nets in the lowest level of the partition hierarchy, and gradually progress to route nets in higher levels of the partition hierarchy. There is more parallelism at lower levels of the partition hierarchy than at upper levels of the partition hierarchy because there are more non-overlapping partitions at the lower levels of the partition hierarchy.

Figure 5:
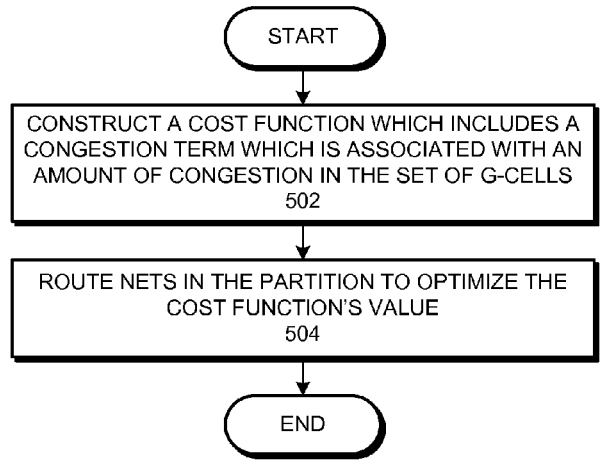
FIG. 5 presents a flow chart illustrating a process for iteratively routing a set of nets in a partition to eliminate routing congestion on a set of g-cells in accordance with an embodiment of the present invention.

FIG. 5 presents a flow chart illustrating a process for routing a set of nets in a partition in accordance with an embodiment of the present invention.

Note that a partition can be divided into a set of g-cells. The process can begin by constructing a cost function which includes a congestion term which is associated with an amount of congestion in the set of g-cells (operation 502). Next, the system can route nets in the partition of the circuit design to optimize the cost function's value (operation 504).

In some embodiments, operations 502-504 can be performed for each partition, i.e., operations 502-504 are performed when operation 410 in FIG. 4 is performed. Further, the system can increase the congestion term's weight during operation 414 in FIG. 4. Note that in the first iteration, the overflow cost (i.e., the penalty for exceeding a g-cell's capacity) is low. Hence, the process will route wires very close to their optimal routes that minimize wire length and via count. However, this routing will most likely result in congestion points. As the system gradually increases the congestion term's weight, the system will re-route nets around the congestion hotspots. This iterative approach makes the routing quality less dependent on routing order, and therefore allows the system to get close to a global optimum.

Figure 6A:
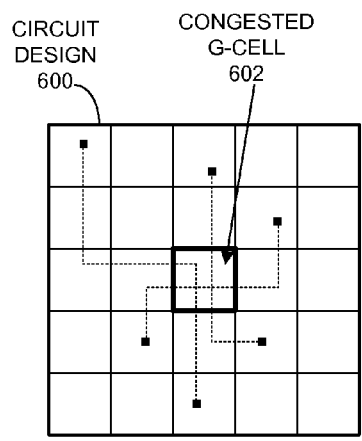
FIGS. 6A and 6B illustrate nets of a circuit design that have been re-routed to eliminate congestion in accordance with an embodiment of the present invention.
Figure 6B:
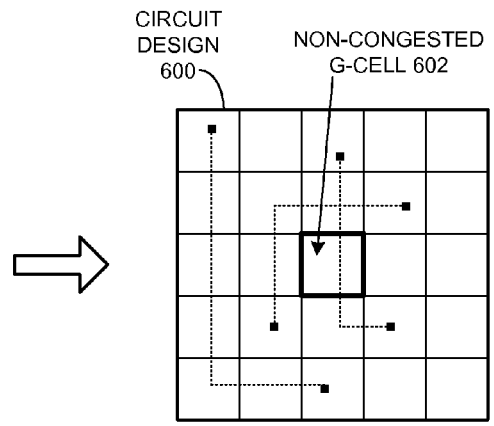

FIGS. 6A and 6B illustrate nets of a circuit design that have been re-routed to eliminate congestion in accordance with an embodiment of the present invention.

As shown in FIG. 6A, circuit design 600 is divided into a set of g-cells, and includes a set of wires routed through the set of g-cells. Suppose that the density of wires through g-cell 602 exceeds the g-cell's capacity, which causes g-cell 602 to be flagged as being congested (note that FIG. 6A illustrates three nets passing through g-cell 602). During the iterative global routing process, the nets passing through g-cell 602 may be re-routed using a higher congestion cost to produce the routing solution illustrated in FIG. 6B. Specifically, in FIG. 6B, the density of wires for g-cell 602 does not exceed the g-cell's capacity, and thus g-cell 602 is no longer congested (note that FIG. 6B illustrates only one net passing through g-cell 602).

FIG. 7A illustrates nets that are routed in parallel for non-overlapping partitions in accordance with an embodiment of the present invention.

Circuit design 700 is divided into partitions 706-712, such that some of these partitions overlap (e.g., partitions 706-710). Further, circuit design 700 includes at least one set of points which is associated with a net and which needs to be electrically linked together (e.g., set 702 and set 704). If the nets associated with set 702 and set 704 are completely within two non-overlapping partitions, the corresponding nets can be routed in parallel. For example, set 702 is completely within partition 706, and set 704 is completely within partition 712. Since partition 706 and partition 712 are non-overlapping partitions, the nets for set 702 and set 704 can be routed in parallel.

FIG. 7B illustrates a hierarchy of partitions for a circuit design in accordance with an embodiment of the present invention.

Circuit design 720 is divided into sets of partitions, which can belong to a hierarchy of partitions. Specifically, partition 724 can belong to a set of partitions that is at the lowest level in the hierarchy. Partitions 726 and 728 can belong to sets of partitions that are at progressively higher levels in the hierarchy. A net (e.g., a net that electrically couples points in set 722) can be associated with any partition that completely encloses the bounding box for the net. For example, the net that electrically couples the points in set 722 may be associated with any of partitions 724-728.

FIG. 8 illustrates a net assigned to a partition of a circuit design based in part on a bounding box for the net in accordance with an embodiment of the present invention.

Note that, in circuit design 800, net 801 is initially assigned to the smallest partition, namely partition 802, which encloses net 801's bounding box 806. Similarly, net 803 is initially assigned to partition 804, which is the smallest partition that encloses net 803's bounding box 808. Since partitions 802 and 804 do not overlap, nets 801 and 803 can be routed in parallel.

If nets 801 and 803 need to be re-routed (e.g., because they are routed through g-cells which are congested), the system may increase the size of their bounding boxes (e.g., bounding boxes 806 and 808) so that nets 801 and 803 can be re-routed using the additional routing resources.

If bounding boxes 806 and 808 are increased in size, nets 801 and 803 may then need to be assigned to larger partitions that provide more routing resources for routing nets 801 and 803. Specifically, as shown in FIG. 8, net 821 of circuit design 820 can be assigned to a partition 822 that is higher up in the partition hierarchy than partition 802 of circuit design 800. Similarly, net 823 of circuit design 820 can be assigned to a partition 824 that is higher up in the partition hierarchy than partition 804 of circuit design 800. However, note that, since partitions 822 and 824 overlap, nets 821 and 823 can no longer be routed in parallel.

As the global routing process progresses, the amount of parallelism may decrease because the process may use larger partitions for some nets. However, the number of nets that are routed in later iterations is also fewer because the nets that are successfully routed in earlier iterations are not routed again. Hence, even though the amount of parallelism decreases in later iterations, it does not severely impact the total run time because the number of nets that need to be routed in later iterations is also fewer.

Multi-Threaded Track Assignment

During track assignment, the system assigns tracks to wires of a circuit design based on the wire's path as determined by the global routing process. For example, the global routing process may determine that a wire passes through a set of g-cells. The track assignment process can then assign a track to a wire for each g-cell that the wire passes through.

Figure 9:
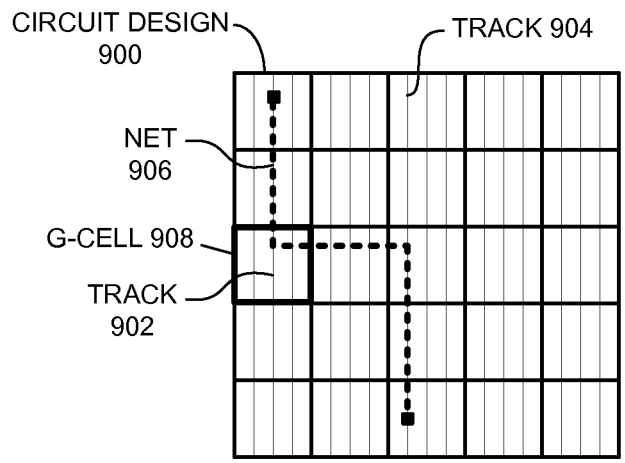
FIG. 9 illustrates track assignments for a wire of a circuit design in accordance with an embodiment of the present invention.

FIG. 9 illustrates track assignments for a wire of a circuit design in accordance with an embodiment of the present invention.

Each square box of circuit design 900 can be a g-cell (e.g., g-cell 908), and each g-cell can have multiple tracks (e.g., track 902). The system can also divide the chip into larger or smaller areas which are different from g-cells for purposes of track assignment. The thin vertical lines illustrated in FIG. 9 are vertical tracks (e.g., tracks 902 and 904). The circuit design can also include horizontal tracks which have not been illustrated in FIG. 9 for the sake of clarity. During track assignment, the system assigns tracks to net. For example, the system may assign track 902 to the portion of net 906 that passes through g-cell 908.

Figure 10:
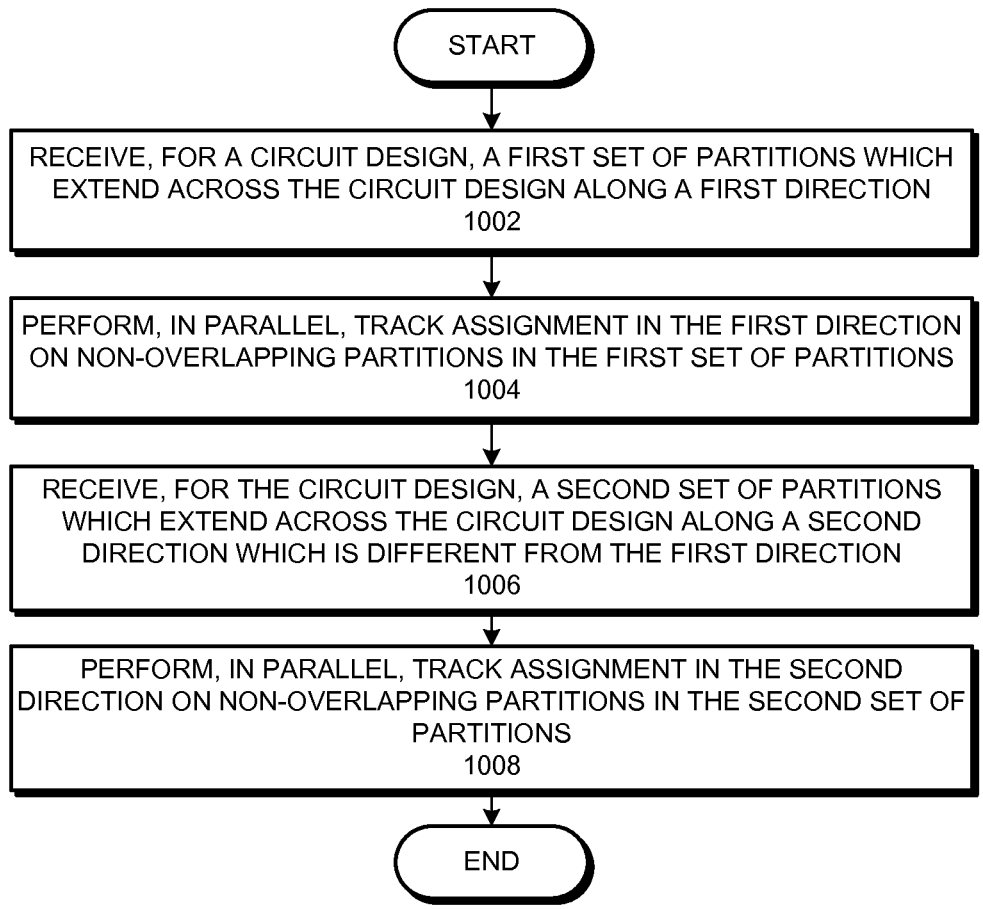
FIG. 10 illustrates a process for assigning tracks to wires of a circuit design in accordance with an embodiment of the present invention.

FIG. 10 illustrates a process for assigning tracks to wires of a circuit design in accordance with an embodiment of the present invention.

During track assignment, the design area can be divided into a set of partitions which extend across the circuit design along one of the directions. The process can begin by receiving, for a circuit design, a first set of partitions which extend across the circuit design along a first direction (operation 1002). Next, the system can perform, in parallel, track assignment in the first direction on non-overlapping partitions in the first set of partitions (operation 1004). Note that two or more partitions in the first set of partitions can overlap with each other. Since each partition spans the whole design in the first direction, it is guaranteed that track assignment operations performed by two different threads on two non-overlapping partitions will not cause any unintended consequences due to interactions between the track assignment operations.

In some embodiments, each track assignment process being performed in parallel performs track assignments on a different net in order to be able to update the routing shapes of nets in parallel. It will be apparent to one skilled in the art that a variety of techniques can be used to ensure that only one track assignment process operates on a net at any given time. For example, the system can use locks. Before performing track assignment for a net, the thread tries to lock the net so that no other thread can perform track assignment on the net while this thread is performing track assignment. If the thread is able to obtain a lock for the net, the thread proceeds with track assignment. On the other hand, if the thread is unable to obtain a lock, the thread defers track assignment to a later time, e.g., by moving the net to the end of a queue which includes nets on which track assignment needs to be performed.

The system then receives, for the circuit design, a second set of partitions which extend across the circuit design along a second direction which is different from the first direction (operation 1006). Note that two or more partitions in the second set of partitions can overlap with each other. The system then performs, in parallel, track assignments in the second direction on non-overlapping partitions in the second set of partitions (operation 1008).

For example, the first direction can be the horizontal direction and the second direction can be the vertical direction. Thus, the system may perform track assignments in the horizontal direction before performing track assignments in the vertical direction. In a second example, the first direction can be the vertical direction and the second direction can be the horizontal direction. Thus, the system may perform track assignments in the vertical direction before performing track assignments in the horizontal direction.

FIG. 11A illustrates a circuit design divided into a set of horizontal partitions in accordance with an embodiment of the present invention.

Specifically, the design area is divided into partitions 1102-1106 which extend across the entire design area. Note that partition 1104 overlaps with partition 1106. Track assignment can be performed in parallel on partitions 1102 and 1104, or on partitions 1102 and 1106. However, because partition 1104 overlaps with partition 1106, track assignment is not performed in parallel for partitions 1104 and 1106.

FIG. 11B illustrates a circuit design divided into a set of vertical partitions in accordance with an embodiment of the present invention.

Specifically, the design area is divided into partitions 1112-1116 which extend across the entire design area. Note that partition 1114 overlaps with partition 1116. Track assignment can be performed in parallel on partitions 1112 and 1114, or on partitions 1112 and 1116. However, because partition 1114 overlaps with partition 1116, track assignment is not performed in parallel for partitions 1114 and 1116.

Note that if the partitions do not extend across the entire circuit design, the track assignment process may need to ensure that the track assignments in adjacent partitions are consistent. For example, suppose we broke partition 1104 into two partitions: one on the left and one on the right. Now, if a net had a wire that spanned both partitions, then the track assignment process would need to ensure that the same track was assigned in both partitions. If the system assigned different tracks to the wire in different partitions, the system would have to insert jogs at the partition boundaries, which is undesirable. A benefit of creating partitions that extend across the circuit design is that it obviates the need to ensure consistency between adjacent partitions.

Multi-Threaded Detailed Routing

FIG. 12 illustrates a suboptimal routing solution for a wire of a circuit design in accordance with an embodiment of the present invention.

Circuit design 1200 is divided into a set of partitions (e.g., partitions 1202-1206), and includes wire 1208 that passes through partitions 1202-1206. The detailed routing process can affect how wire 1208 is routed across these partitions. For example, circuit design 1210 includes wire 1218 that passes through partitions 1212-1216. After detailed routing is performed on partitions 1212-1216, the routed wire 1218 has discontinuities at the partition boundaries. These discontinuities can be fixed by adding jogs, e.g., short vertical wire segments that electrically connect the wire segments in partitions 1212-1216. However, it is undesirable to have such jogs in the routing solution. Hence, the routing solution illustrated in circuit design 1210 is suboptimal.

Multi-threaded detailed routing can lead to suboptimal routing solutions because changes to the routing in one partition can affect how routing is to be performed in other partitions. Some embodiments of the present invention provide systems and techniques for performing multi-threaded detailed routing that does not suffer from the aforementioned drawbacks.

Figure 13:
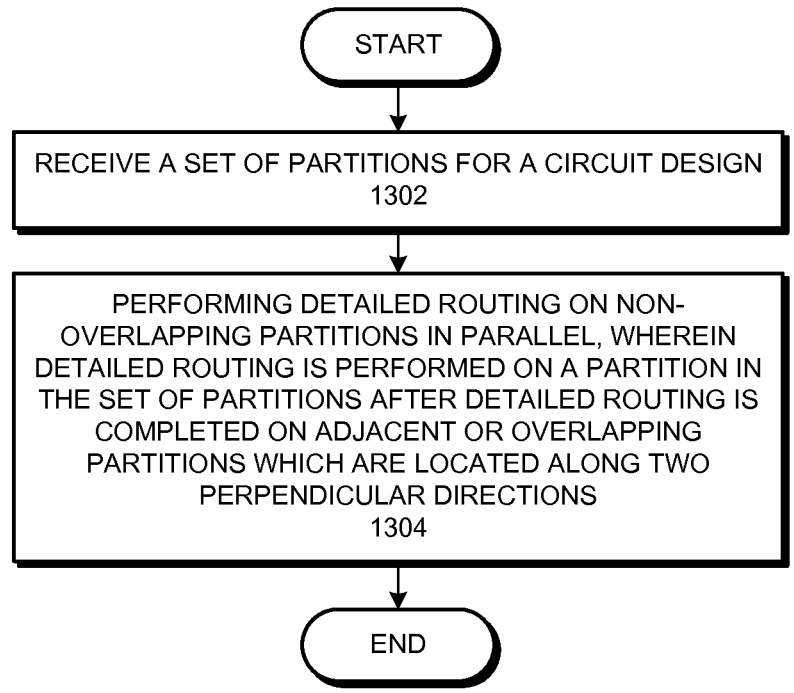
FIG. 13 presents a flow chart illustrating a process for performing detailed routing in parallel for a set of partitions of a circuit design in accordance with an embodiment of the present invention.

FIG. 13 presents a flow chart illustrating a process for performing detailed routing in parallel for a set of partitions of a circuit design in accordance with an embodiment of the present invention.

The design area of a circuit can be divided into a set of overlapping or non-overlapping partitions. The process can begin by receiving a set of partitions for a circuit design (operation 1302). A partition can have zero or more overlapping or non-overlapping partitions along four directions. Then, the system can perform detailed routing on non-overlapping partitions in parallel, wherein detailed routing is performed on a partition in the set of partitions after detailed routing is completed on adjacent or overlapping partitions which are located along two perpendicular directions (operation 1304). In other words, the system performs detailed routing on the partitions in a particular order that ensures that routing decisions made in adjacent partitions will be consistent with one another. Note that in the initial iterations, detailed routing is likely to be performed on all partitions. However, in later iterations, detailed routing may be performed on a few partitions to fix design rule violations. In these situations, the partitions may be non-overlapping and may be located far away from one another. If so, the system can perform detailed routing on these partitions in parallel without imposing any additional dependencies between the partitions.

In some embodiments, the system can begin at a corner partition of the circuit design, and progress by growing a continuous front until the whole design is routed. Performing detailed routing in this fashion enables the system to generate a consistent and nearly optimal detailed routing solution.

Specifically, the aforementioned two perpendicular directions can be up and left, and the detailed routing process can begin at the top left partition of the circuit design and progress toward the bottom right partition. In a second example, the aforementioned two perpendicular directions can be up and right, and the detailed routing process can begin at the top right partition of the circuit design and progress toward the bottom left partition. In a third example, the aforementioned two perpendicular directions can be down and left, and the detailed routing process can begin at the bottom left partition of the circuit design and progress toward the top right partition. In a fourth example, the aforementioned two perpendicular directions can be down and right, and the detailed routing process can begin on the bottom right partition of the circuit design and progress toward the top left partition.

Techniques and systems for creating a specific ordering of the partitions for performing detailed routing are discussed next. Note that these systems and techniques have been presented for illustration purposes only and are not intended to limit the scope of the present invention.

In some embodiments of the present invention, the system maintains a task queue. Each detailed routing task is queued in the task queue. A detailed routing task can be a task that performs detailed routing on a particular partition. Then, each thread performed by the system selects a detailed routing task from the task queue and performs the task if possible. If a thread cannot perform a task, the thread inserts the task at the end of the queue and selects another task from the task queue.

The system determines whether a thread can perform detailed routing on a partition by determining whether routing decisions made on this partition will affect routing decisions made on another partition that is being routed in parallel. For example, if two partitions overlap and detailed routing is being performed on one of the two partitions, the system does not perform detailed routing on the second partition until the routing operation completes on the first partition.

Further, the system performs detailed routing in an order that ensures that the routing solution is consistent and optimal (e.g., does not require unnecessary jogs to be introduced). To impose this ordering, the system can assign index values to partitions, and can select partitions from the task queue based in part on the ordering of their index values. For example, the system can assign index values by starting from one corner and growing the continuous front until index values are assigned to all partitions.

Figure 14:
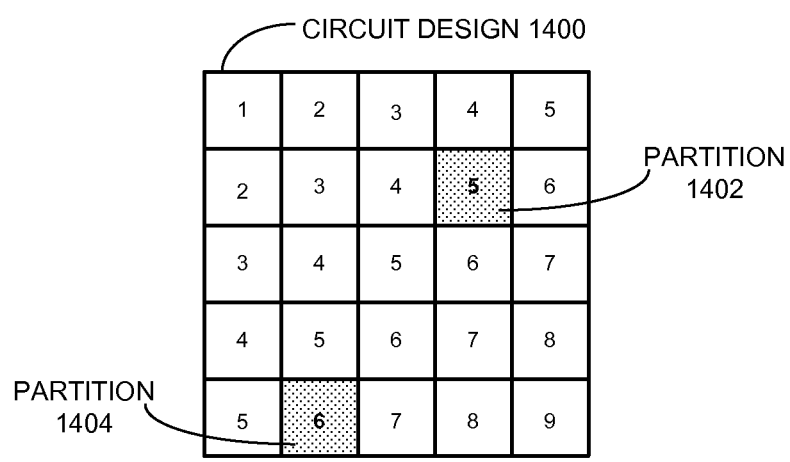
FIG. 14 illustrates an exemplary ordering for performing detailed routing operations on a set of partitions of a circuit design in accordance with an embodiment of the present invention.

FIG. 14 illustrates an exemplary ordering for performing detailed routing operations on a set of partitions of a circuit design in accordance with an embodiment of the present invention.

Each square illustrated in FIG. 14 is a partition, and the number in a partition imposes an order in which the partitions can be processed. Note that partitions can overlap with one another. However, for the sake of clarity and ease of discourse, the partitions in FIG. 14 are shown without overlaps. It will be apparent to one of ordinary skill in the art that the techniques and systems for imposing a processing order can be used when the partitions overlap. The exemplary ordering corresponds to a routing process that starts at the top left corner partition in the circuit design and sweeps diagonally across the design to the bottom right corner of the circuit design.

A partition can be worked on after all of its neighboring partitions that have lower indices have been completed. For example, partition 1404 with index "6" can be worked on after its two adjacent partitions with index "5" have been completed. Note that a partition with index "6" can be routed in parallel with a partition with an index "5" as long as they are not adjacent. For example, partitions 1402 and 1404 in FIG. 14 can be routed in parallel. In this manner, interdependencies can be created among the different detailed routing tasks in the task queue to ensure that the multiple parallel detailed routing operations produce a consistent and optimal routing solution.

Additionally, note that if the system is performing detailed routing on a net, the system can lock the net to prevent the same net from being routed in parallel in another partition (e.g., by a different processing thread of the system). In other words, in addition to creating interdependencies among the routing tasks for different partitions, the system can also ensure that each net is routed by only one processing thread at any given time.

In some embodiments, the system can use locks to ensure that only one thread operates on a partition at any given time. Specifically, each processing thread of the system maintains a queue of nets in the partition on which the processing thread can perform detailed routing. During operation, a thread selects the first net in the queue for performing detailed routing. If the net is locked by another processing thread, the thread inserts the net at the end of the queue and selects the next net in the queue.

Note that locking a net does not cause the routing process to become sequential because each partition typically includes multiple nets. For example, suppose a net spans four partitions which are being processed by four parallel threads. The first thread may lock a net so that the other three threads will not be able to route the net in their partitions. However, the other three threads can perform detailed routing on other nets in the partition. Hence, locking a net does not cause the process to become sequential.

Figure 15:
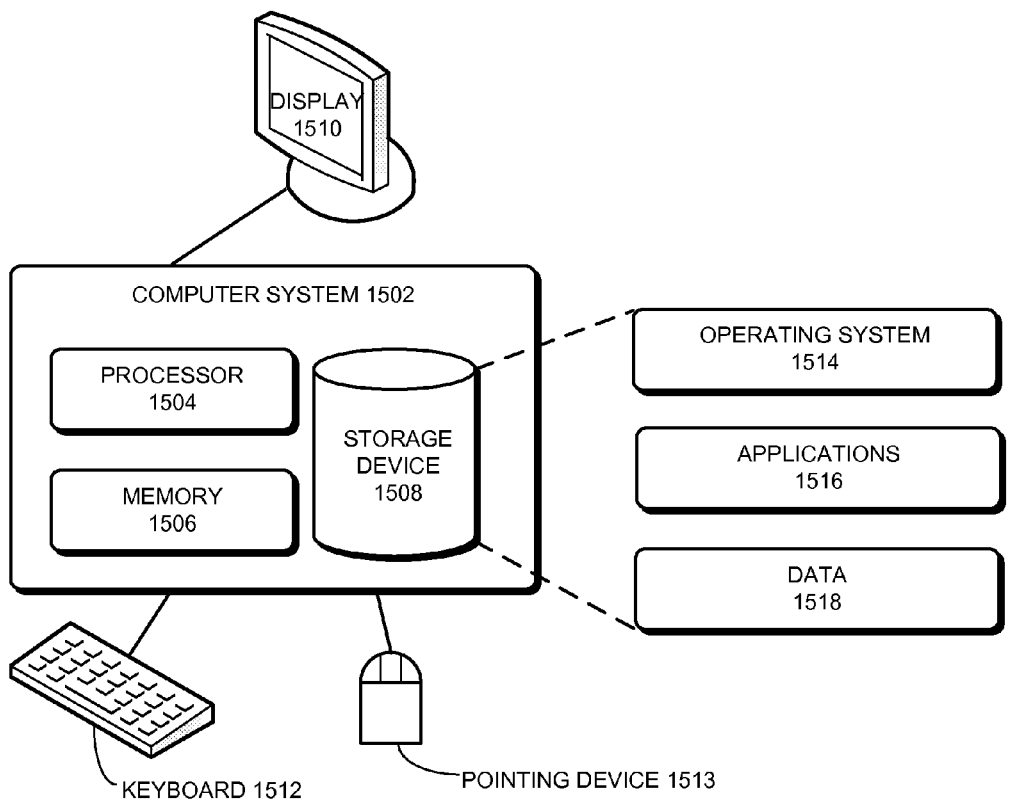
FIG. 15 illustrates a computer system in accordance with an embodiment of the present invention.

FIG. 15 illustrates a computer system in accordance with an embodiment of the present invention.

A computer or computer system can generally be any system that can perform computations. Specifically, a computer can be a microprocessor-based system which may include multiple processing cores, a network-processor-based system, a digital-signal-processor-based system, a portable computing device, a personal organizer, a distributed-computing-platform based system, or any other computing system now known or later developed.

Computer system 1502 includes a processor 1504, a memory 1506, and a storage device 1508. Processor 1504 can include multiple processing cores that can execute multiple threads in parallel. Furthermore, computer system 1502 can be coupled to a display device 1510, a keyboard 1512, and a pointing device 1513. Storage device 1508 can store operating system 1514, applications 1516, and data 1518. Operating system 1508 can support multi-threading.

Applications 1516 can include instructions which, when executed by computer system 1502, can cause computer system 1502 to perform methods and/or processes described in this disclosure. Specifically, applications 1516 can include instructions for partitioning a circuit design into multiple partitions (e.g., a partition hierarchy), performing global routing on multiple partitions in parallel, performing detailed routing on multiple partitions in parallel, and performing track assignments on multiple partitions in parallel.

Data 1518 can include any data that is required as input or that is generated as output by the methods and/or processes described in this disclosure. Specifically, data 1518 can store representations for a circuit design, a partition hierarchy for the circuit design, bounding box information for nets, track assignment information for routed nets, and a routing solution for the circuit design.

Figure 16:
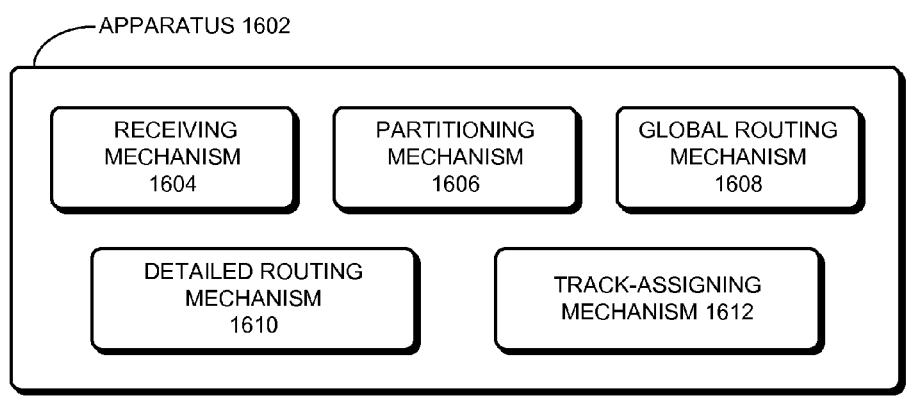
FIG. 16 illustrates an apparatus in accordance with an embodiment of the present invention.

FIG. 16 illustrates an apparatus in accordance with an embodiment of the present invention.

Apparatus 1602 can comprise a plurality of mechanisms which may communicate with one another via a wired or wireless communication channel. Apparatus 1602 may be realized using one or more integrated circuits, and apparatus 1602 may include fewer or more mechanisms than those shown in FIG. 16. Further, apparatus 1602 may be integrated in a computer system, or it may be realized as a separate device which is capable of communicating with other computer systems and/or devices. Specifically, apparatus 1602 can comprise receiving mechanism 1604, partitioning mechanism 1606, global routing mechanism 1608, detailed routing mechanism 1610, and track-assigning mechanism 1612.

In some embodiments, receiving mechanism 1604 may be configured to receive a set of nets in a circuit design which need to be routed, and partitioning mechanism 1606 may be configured to partition the circuit design into multiple sets of partitions. Global routing mechanism 1608 may be configured to route nets in non-overlapping partitions of the circuit design in parallel. Further, detailed routing mechanism 1610 may be configured to perform, in parallel, detailed routing on partitions in the set of partitions in a particular order.

In some embodiments, track-assigning mechanism 1612 may be configured to perform, in parallel, track assignments on a set of non-overlapping partitions of the circuit design, wherein each partition in the set of partitions extends across the circuit design along a horizontal or vertical direction.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for performing detailed routing, the method comprising:
receiving a set of partitions for a circuit design, wherein each partition includes at least two nets, and wherein at least two partitions in the set of partitions overlap with each other; and
performing, by one or more computers, detailed routing on the set of partitions in parallel, wherein said performing includes:

selecting a partition from the set of partitions such that detailed routing is currently not being performed on any partition that overlaps with the partition or that is adjacent to the partition, and performing detailed routing on the selected partition, comprising performing detailed routing on only the portion of a net that is within the partition when the net spans at least two partitions.

2. The computer-implemented method of claim 1, wherein said selecting includes selecting the partition detailed routing is completed on all partitions, if any, that overlap with the partition or that are adjacent to the partition along two perpendicular directions.

3. The computer-implemented method of claim 2, wherein the two perpendicular directions are up and left, and wherein the detailed routing process begins at the top left partition and progresses towards the bottom right partition.

4. The computer-implemented method of claim 2, wherein the two perpendicular directions are up and right, and wherein the detailed routing process begins at the top right partition and progresses towards the bottom left partition.

5. The computer-implemented method of claim 2, wherein the two perpendicular directions are down and left, and wherein the detailed routing process begins at the bottom left partition and progresses towards the top right partition.

6. The computer-implemented method of claim 2, wherein the two perpendicular directions are down and right, and wherein the detailed routing process begins at the bottom right partition and progresses towards the top left partition.

7. The computer-implemented method of claim 1, wherein each detailed routing process being performed in parallel performs detailed routing on a different net.

8. A non-transitory computer-readable storage medium storing instructions that when executed by a computer cause the computer to perform a method for performing detailed routing, the method comprising:

receiving a set of partitions for a circuit design, wherein each partition includes at least two nets, and wherein at least two partitions in the set of partitions overlap with each other; and performing detailed routing on the set of partitions in parallel, wherein said performing includes:

selecting a partition from the set of partitions such that detailed routing is currently not being performed on any partition that overlaps with the partition or that is adjacent to the partition, and performing detailed routing on the selected partition, comprising performing detailed routing on only the portion of a net that is within the partition when the net spans at least two partitions.

9. The non-transitory computer-readable storage medium of claim 8, wherein said selecting includes selecting the partition detailed routing is completed on all partitions, if any, that overlap with the partition or that are adjacent to the partition along two perpendicular directions.

10. The non-transitory computer-readable storage medium of claim 9, wherein the two perpendicular directions are up and left, and wherein the detailed routing process begins at the top left partition and progresses towards the bottom right partition.

11. The non-transitory computer-readable storage medium of claim 9, wherein the two perpendicular directions are up and right, and wherein the detailed routing process begins at the top right partition and progresses towards the bottom left partition.

12. The non-transitory computer-readable storage medium of claim 9, wherein the two perpendicular directions are down and left, and wherein the detailed routing process begins at the bottom left partition and progresses towards the top right partition.

13. The non-transitory computer-readable storage medium claim 9, wherein the two perpendicular directions are down and right, and wherein the detailed routing process begins at the bottom right partition and progresses towards the top left partition.

14. The non-transitory computer-readable storage medium of claim 8, wherein each detailed routing process being performed in parallel performs detailed routing on a different net.

15. An apparatus for performing detailed routing, comprising:

a receiving mechanism configured to receive a set of partitions for a circuit design, wherein each partition includes at least two nets, and wherein at least two partitions in the set of partitions overlap with each other; and a detailed routing mechanism configured to perform detailed routing on the set of partitions in parallel, wherein said performing includes:

selecting a partition from the set of partitions such that detailed routing is currently not being performed on any partition that overlaps with the partition or that is adjacent to the partition, and performing detailed routing on the selected partition, comprising performing detailed routing on only the portion of a net that is within the partition when the net spans at least two partitions.

16. The apparatus of claim 15, wherein said selecting includes selecting the partition detailed routing is completed on all partitions, if any, that overlap with the partition or that are adjacent to the partition along two perpendicular directions.

17. The apparatus of claim 16, wherein the two perpendicular directions are up and left, and wherein the detailed routing process begins at the top left partition and progresses towards the bottom right partition.

18. The apparatus of claim 16, wherein the two perpendicular directions are up and right, and wherein the detailed routing process begins at the top right partition and progresses towards the bottom left partition.

19. The apparatus of claim 16, wherein the two perpendicular directions are down and left, and wherein the detailed routing process begins at the bottom left partition and progresses towards the top right partition.

20. The apparatus of claim 16, wherein the two perpendicular directions are down and right, and wherein the detailed routing process begins at the bottom right partition and progresses towards the top left partition.

21. The apparatus of claim 15, wherein each detailed routing process being performed in parallel performs detailed routing on a different net.

* * * * *